United States Patent
Brunschwiler et al.

(10) Patent No.: US 8,937,810 B2
(45) Date of Patent: Jan. 20, 2015

(54) ELECTRONIC ASSEMBLY WITH DETACHABLE COOLANT MANIFOLD AND COOLANT-COOLED ELECTRONIC MODULE

(75) Inventors: Thomas J. Brunschwiler, Thalwil (CH); Evan G. Colgan, Chestnut Ridge, NY (US); Michael J. Ellsworth, Jr., Poughkeepsie, NY (US); Werner Escher, Zurich (CH); Ingmar G. Meijer, Zurich (CH); Stephan Paredes, Zurich (CH); Gerd Schlottig, Zurich (DE); Martin Witzig, Horgen (CH); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 13/616,337

(22) Filed: Sep. 14, 2012

(65) Prior Publication Data

US 2014/0078672 A1    Mar. 20, 2014

(51) Int. Cl.
*H05K 7/20*    (2006.01)
*H01L 23/46*    (2006.01)

(52) U.S. Cl.
USPC ........... 361/699; 361/702; 361/704; 361/715; 165/80.4; 165/104.33; 165/185; 257/714

(58) Field of Classification Search
USPC ................. 361/679.53, 699, 702, 704, 715; 165/80.4, 104.33, 185; 257/714–715
See application file for complete search history.

(56) References Cited

U.S. PATENT DOCUMENTS

| | | | |
|---|---|---|---|
| 6,058,010 A | 5/2000 | Schmidt et al. | |
| 6,943,444 B2 | 9/2005 | von Gutfeld et al. | |
| 7,149,087 B2 | 12/2006 | Wilson et al. | |
| 7,188,662 B2 * | 3/2007 | Brewer et al. | 165/80.4 |
| 7,331,378 B2 * | 2/2008 | Bhatti et al. | 165/80.4 |
| 7,420,808 B2 | 9/2008 | Campbell et al. | |
| 7,508,669 B2 | 3/2009 | Fonfara et al. | |

(Continued)

OTHER PUBLICATIONS

"OCZ Hydroflow CPU Waterblock Review", retrieved from http://martinsliquidlab.i4mwmory.com/OCZ_Hydroflow_Review.html on Sep. 5, 2014, 10 pages.*

(Continued)

*Primary Examiner* — Robert J Hoffberg
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooled electronic assemblies, and a method of decoupling a cooled electronic assembly, are provided. In one embodiment, the assembly includes a coolant-cooled electronic module with one or more electronic components and one or more coolant-carrying channels integrated within the module and configured to facilitate flow of coolant through the module for cooling the electronic component(s). In addition, the assembly includes a coolant manifold structure detachably coupled to the electronic module. The manifold structure, which includes a coolant inlet and outlet in fluid communication with the coolant-carrying channel(s) of the electronic module, facilitates flow of coolant through the coolant-carrying channel, and thus cooling of the electronic component(s). Coolant-absorbent material is positioned at the interface between the electronic module and the manifold structure to facilitate absorbing any excess coolant during a stepwise detaching of the manifold structure from the electronic module.

16 Claims, 12 Drawing Sheets

(56) References Cited

U.S. PATENT DOCUMENTS

| | | |
|---|---|---|
| 7,551,441 B2 | 6/2009 | Cohen |
| 7,768,782 B2 | 8/2010 | Cohen |
| 7,864,537 B2 | 1/2011 | Kim |
| 7,990,711 B1 | 8/2011 | Andry et al. |
| 8,066,057 B2 | 11/2011 | Olesen |
| 8,564,952 B2 * | 10/2013 | Campbell et al. ............ 361/700 |
| 2007/0044940 A1 | 3/2007 | Shiozawa |
| 2010/0085712 A1 | 4/2010 | Hrehor, Jr. et al. |
| 2013/0027878 A1 * | 1/2013 | Campbell et al. ............ 361/694 |
| 2013/0027884 A1 * | 1/2013 | Campbell et al. ............ 361/700 |
| 2013/0070420 A1 * | 3/2013 | Campbell et al. ............ 361/700 |
| 2013/0077246 A1 * | 3/2013 | Campbell et al. ............ 361/700 |
| 2013/0077247 A1 * | 3/2013 | Campbell et al. ............ 361/700 |
| 2014/0048233 A1 * | 2/2014 | Campbell et al. ........ 165/104.21 |
| 2014/0048242 A1 * | 2/2014 | Campbell et al. ............ 165/185 |
| 2014/0049919 A1 * | 2/2014 | Campbell et al. ............ 361/702 |
| 2014/0198452 A1 * | 7/2014 | Brunschwiler et al. ....... 361/699 |

OTHER PUBLICATIONS

"Busting Out The Science Behind Liquid Cooling", Martin's Liquid Lab, http://www.martinsliquidlab.i4memory.com, 3 pages. (Dec. 2008).

Martin, "Switfech Apogee TTZ CPU Waterblock Review", http://www.martinsliquidlab.i4memory.com (Aug. 26, 2008).

Martin, "OCZ Hydroflow CPU Waterblock Review", http://www.martinsliquidlab.i4memory.com (Sep. 29, 2008).

Campbell et al., "Coolant Manifold with Separately Rotatable Manifold Section(s)", U.S. Appl. No. 13/281,495, filed Oct. 26, 2011.

* cited by examiner

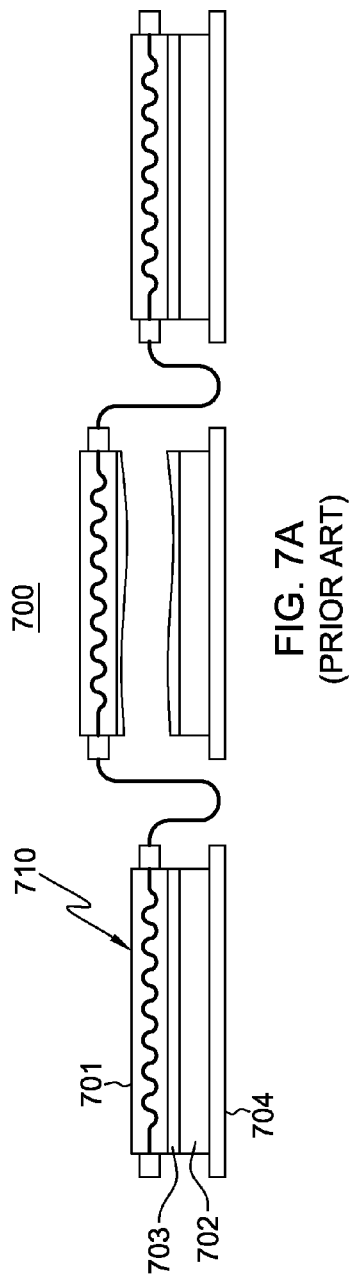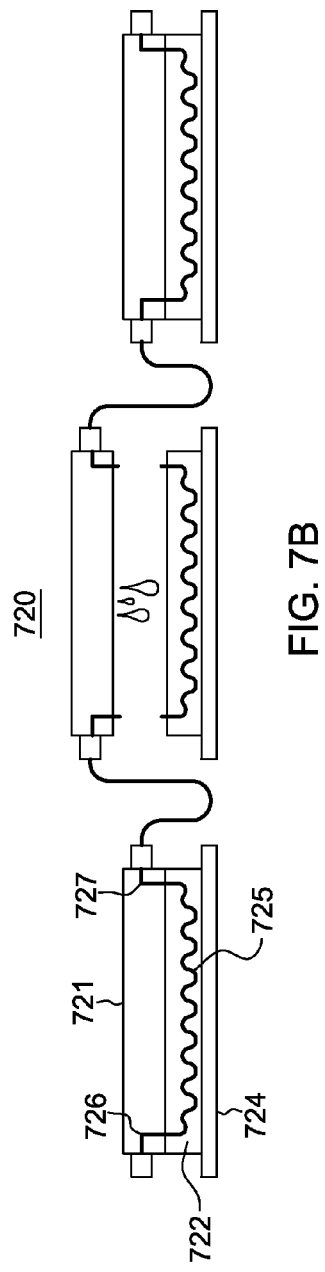

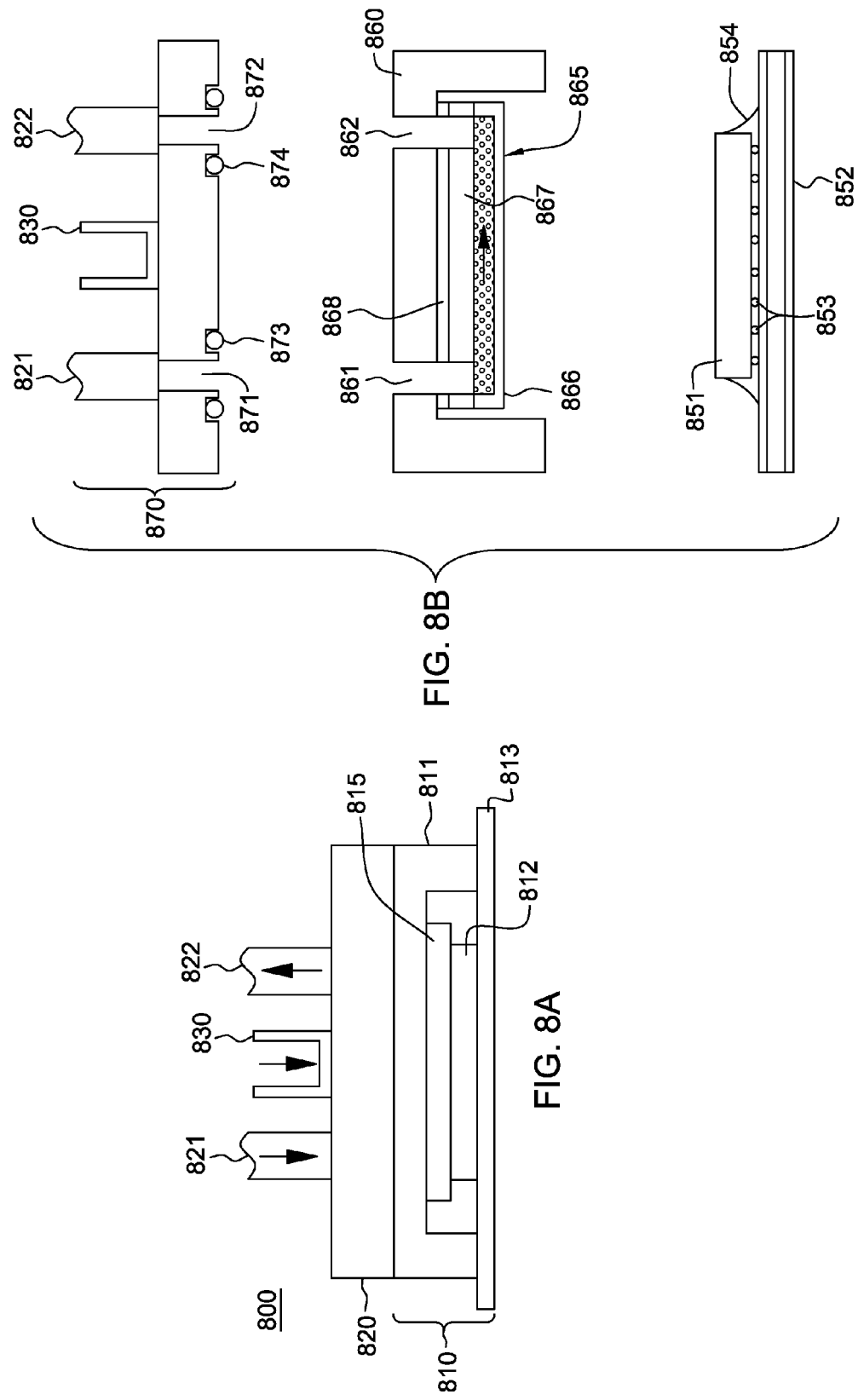

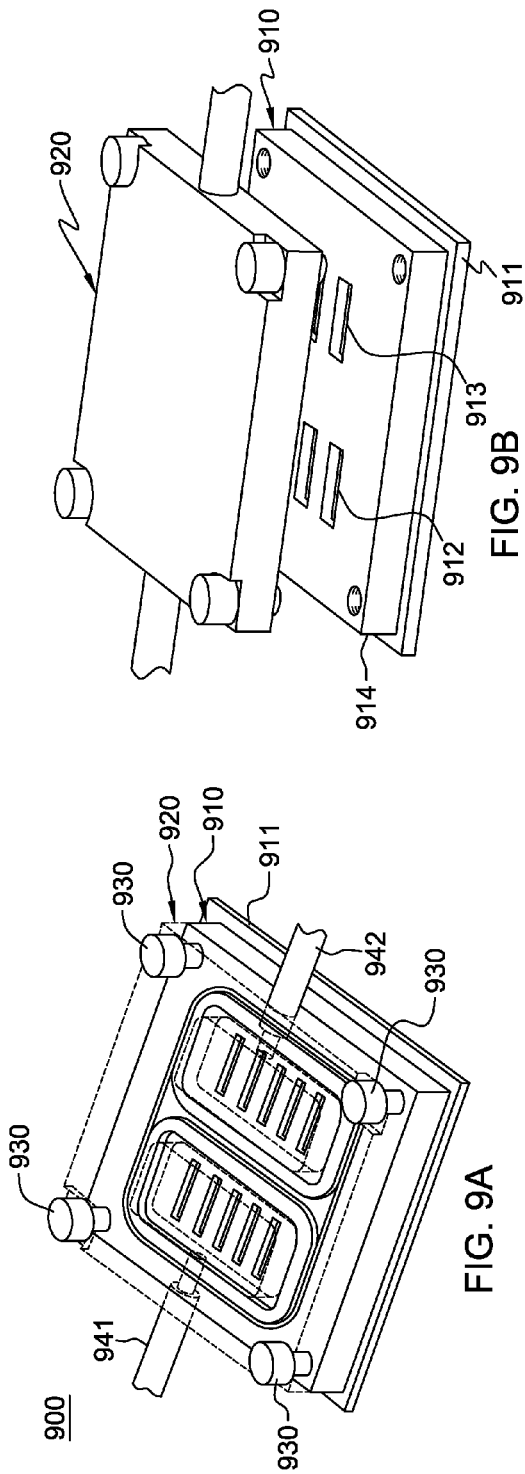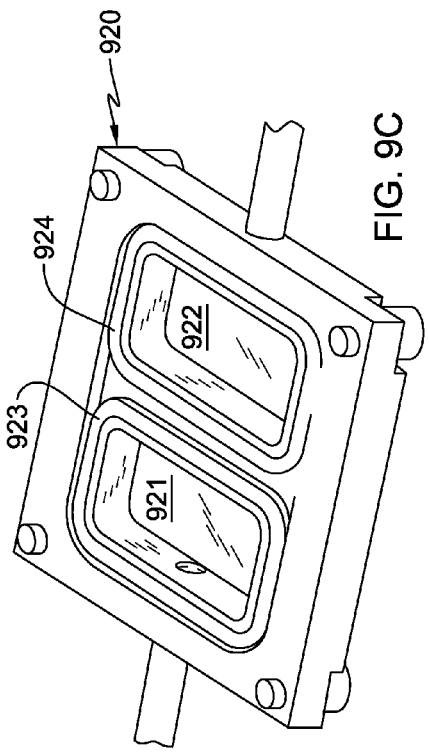

US 8,937,810 B2

ELECTRONIC ASSEMBLY WITH DETACHABLE COOLANT MANIFOLD AND COOLANT-COOLED ELECTRONIC MODULE

BACKGROUND

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

In one aspect, provided herein is a cooled electronic assembly which comprises a coolant-cooled electronic module and a coolant manifold structure. The coolant-cooled electronic module comprises at least one electronic component, and at least one coolant-carrying channel integrated within the coolant-cooled electronic module and configured to facilitate flow of coolant therethrough for cooling the at least one electronic component. The coolant manifold structure is detachably coupled to the coolant-cooled electronic module, and includes a coolant inlet and a coolant outlet in fluid communication with the at least one coolant-carrying channel of the coolant-cooled electronic module. The coolant manifold structure facilitates flow of coolant through the at least one coolant-carrying channel of the coolant-cooled electronic module, and thus, cooling of the at least one electronic component.

In another aspect, a method of fabricating a cooled electronic assembly is provided which includes: providing a coolant-cooled electronic module comprising at least one electronic component, and at least one coolant-carrying channel integrated within the coolant-cooled electronic module and configured to facilitate flow of coolant therethrough for cooling the at least one electronic component; and detachably coupling a coolant manifold structure to the coolant-cooled electronic module, the coolant manifold structure comprising a coolant inlet and at a coolant outlet within the coolant manifold structure, the detachably coupling comprising coupling in fluid communication the coolant inlet and the coolant outlet of the coolant manifold structure to the at least one coolant-carrying channel of the coolant-cooled electronic module, the coolant manifold structure facilitating the flow of coolant through the at least one coolant-carrying channel of the coolant-cooled electronic module, and thereby cooling of the at least one electronic component.

In a further aspect, a method is provided which includes: decoupling a coolant manifold structure from a coolant-cooled electronic module. The decoupling includes: transitioning the coolant manifold structure from a first position to a second position relative to the coolant-cooled electronic module, wherein in the first position, a coolant-absorbent material disposed at an interface between the coolant-cooled electronic module and the coolant manifold structure is at least partially compressed, and in the second position, the coolant-absorbent material is at least partially uncompressed, and wherein transitioning the coolant manifold structure to the second position defines a coolant-tight containment volume at the interface between the coolant manifold structure and the coolant-cooled electronic module, the coolant-absorbent material residing at least partially within the coolant-tight containment volume; allowing coolant within the coolant-tight containment volume to be absorbed by the coolant-absorbent material; and after allowing coolant within the coolant-tight containment volume to be absorbed by the coolant-absorbent material, detaching the coolant manifold structure from the coolant-cooled electronic module.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a schematic of one embodiment of a cooled electronic system comprising multiple conventional cooled electronic assemblies with multiple cold plates coupled via a thermal interface material to multiple electronic modules, wherein one cold plate is shown being detached from its electronic module for, for example, servicing or replacement of the electronic module;

FIG. 7B is a schematic of an alternate embodiment of a cooled electronic system comprising multiple electronic assemblies with multiple coolant-cooled electronic modules and multiple coolant manifold structures detachably coupled thereto, in accordance with one or more aspects of the present invention;

FIG. 8A is a cross-sectional elevational view of another embodiment of a cooled electronic assembly comprising a coolant-cooled electronic module and a coolant manifold structure, in accordance with one or more aspects of the present invention;

FIG. 8B is a partially exploded view of a more detailed embodiment of a cooled electronic assembly comprising a cooled-cooled electronic module and a coolant manifold structure, in accordance with one or more aspects of the present invention;

FIG. 9A depicts another embodiment of a cooled electronic assembly comprising a cooled-cooled electronic module and a coolant manifold structure, in accordance with one or more aspects of the present invention;

FIG. 9B depicts the cooled electronic assembly of FIG. 9A, with the coolant manifold structure and coolant-cooled electronic module shown detached, in accordance with one or more aspects of the present invention;

FIG. 9C depicts an interface surface of the coolant manifold structure of FIGS. 9A & 9B, configured to couple to the coolant-cooled electronic module, in accordance with one or more aspects of the present invention;

DETAILED DESCRIPTION

Figure 1:
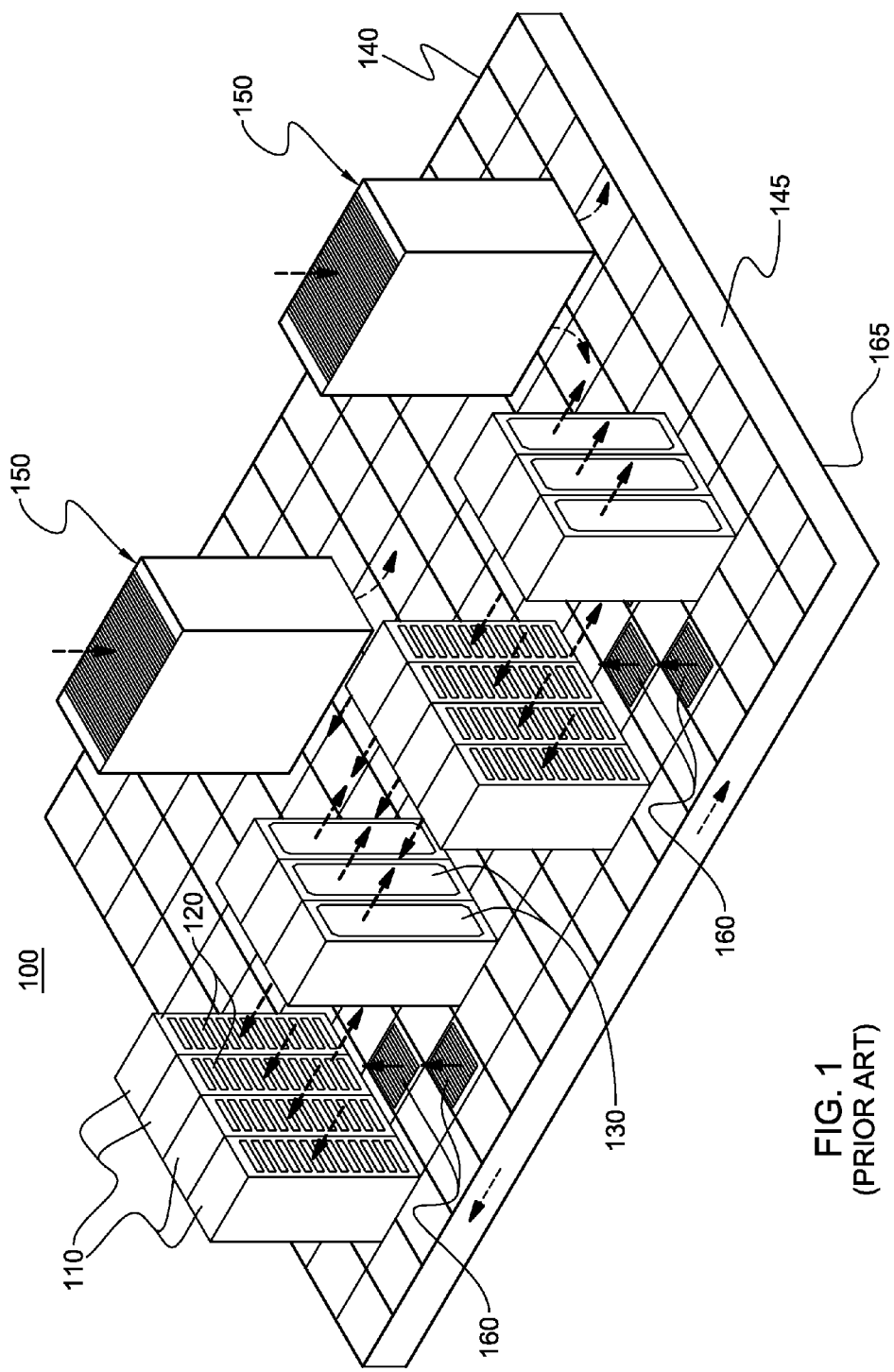
FIG. 1 depicts one embodiment of a conventional raised floor layout of an air-cooled data center.

As used herein, the terms "electronics rack", and "rack-mounted electronic equipment" are used interchangeably, and unless otherwise specified include any housing, frame, rack, compartment, blade server system, etc., having one or more heat-generating components of a computer system or electronics system, and may be, for example, a stand-alone computer processor having high, mid or low end processing capability. In one embodiment, an electronics rack may comprise multiple electronic subsystems. "Electronic subsystem" refers to any sub-housing, blade, book, drawer, node, compartment, etc., of (for example) an electronics rack having one or more heat-generating electronic components disposed therein or thereon. An electronic subsystem of an electronics rack may be movable or fixed relative to the electronics rack, with the rack-mounted electronics drawers of a multi-drawer rack unit and blades of a blade center system being two examples of subsystems of an electronics rack to be cooled. In one specific example, "electronic subsystem" refers to an electronic system which comprises multiple different types of electronic components, and may be, in one example, a server node of a multi-server rack.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat-generating component" refers to a primary heat-generating electronic component within an electronic subsystem, while "secondary heat-generating component" refers to an electronic component of the electronic subsystem generating less heat than the primary heat-generating component to be cooled. Further, unless otherwise specified herein, the terms "coolant-cooled structure" or "coolant-cooled cold plate" refer to a thermally conductive structure having one or more channels or passageways formed therein or thereon for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a coolant (for example, the facility or system coolants discussed below) is water. However, the concepts disclosed herein are readily adapted to use with other types of coolant. For example, one or more of the coolants may comprise a glycol mixture, a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cool air enters the data center via perforated floor tiles 160 from a cool air plenum 145 defined between the raised floor 140 and a base or sub-floor 165 of the room. Cool air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air-conditioning units 150, also disposed within the data center 100. Room air may be taken into one or more air-conditioning units 150 near the upper portions thereof. This room air may comprise, in part, exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, coolant-assisted cooling is being combined with the conventional air-cooling. FIGS. 2-6 illustrate one embodiment of a data center implementation employing a coolant-assisted cooling system with one or more cold plates coupled to high heat-generating electronic components disposed within the electronics racks.

Figure 2:
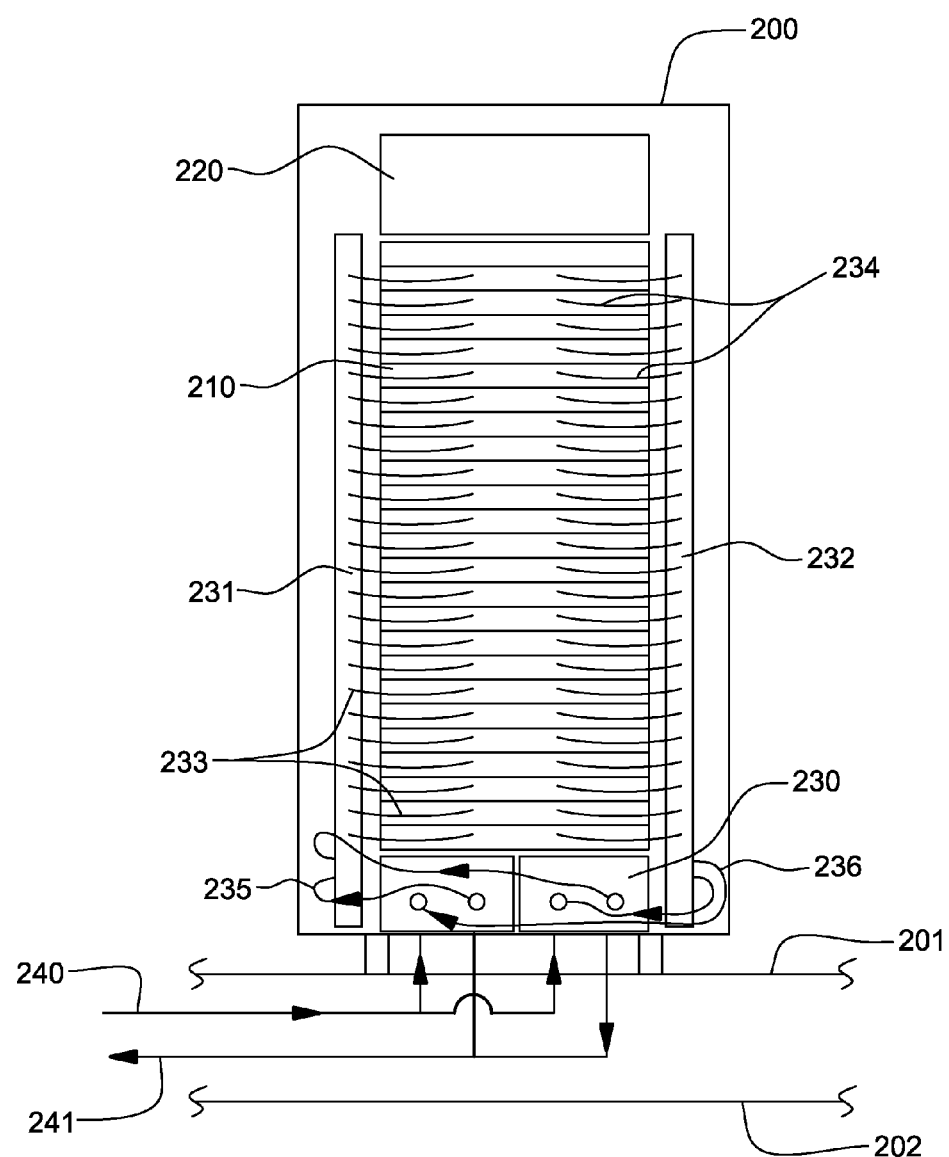
FIG. 2 is a front elevational view of one embodiment of an at least partially coolant-cooled electronics rack comprising multiple electronic subsystems, in accordance with one or more aspects of the present invention.

FIG. 2 depicts one embodiment of a partially coolant-cooled electronics rack 200. As illustrated, coolant-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In certain embodiments described hereinbelow, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
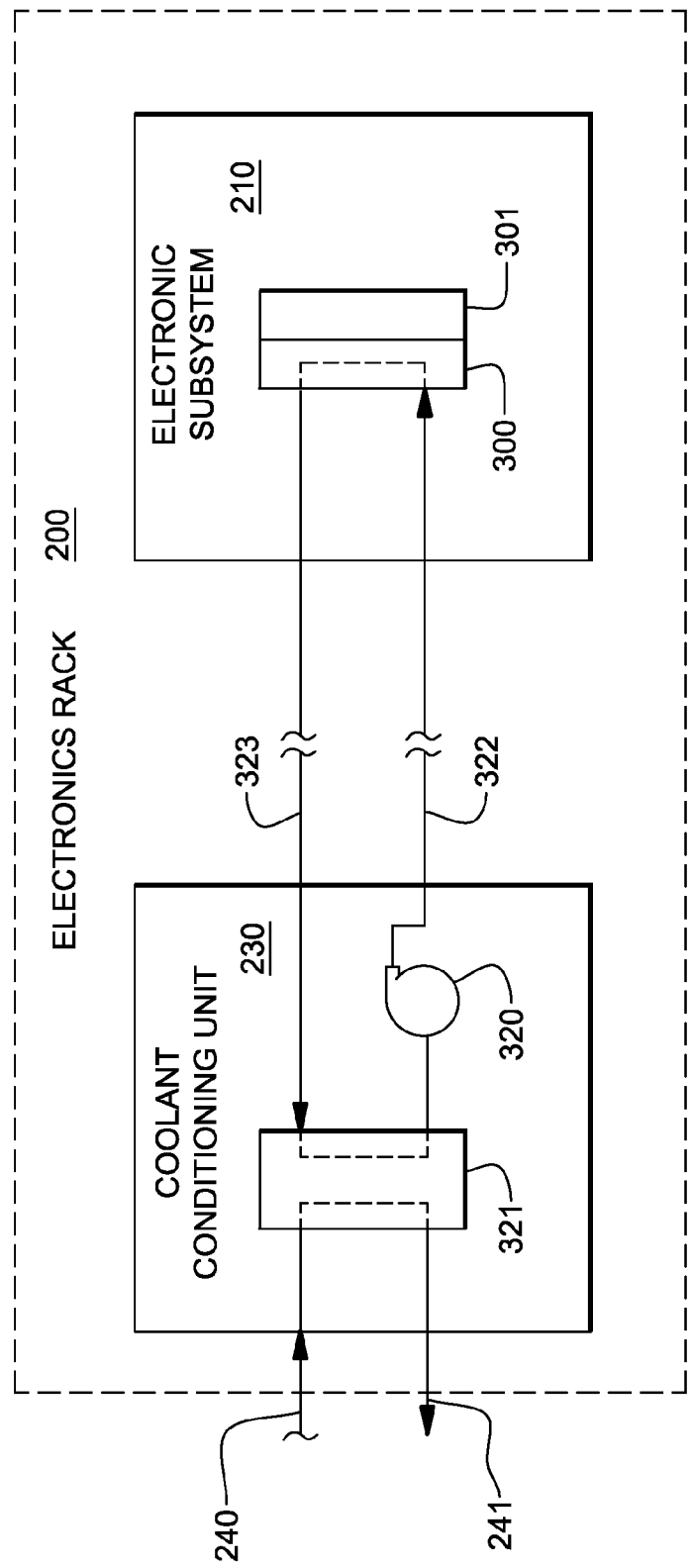
FIG. 3 is a schematic of one embodiment of an electronics rack, wherein an electronic module (or component) is coolant-cooled by system coolant (provided by one or more coolant conditioning units disposed within the electronics rack) passing through a coolant-cooled structure coupled to the electronic module, in accordance with one or more aspects of the present invention.

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
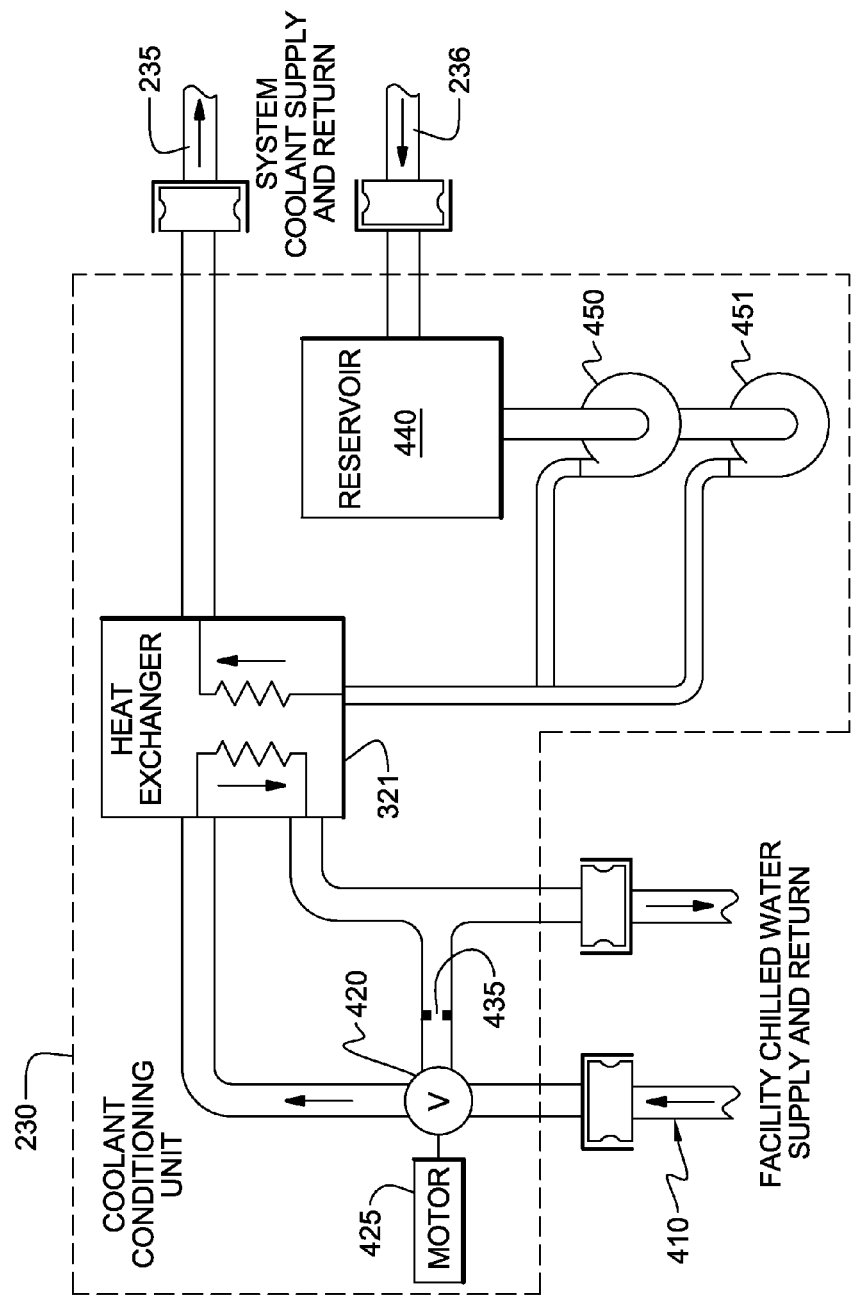
FIG. 4 is a schematic of one embodiment of a coolant conditioning unit disposed within a coolant-cooled electronics rack, in accordance with one or more aspects of the present invention.

FIG. 4 depicts a more detailed embodiment of a coolant conditioning unit 230. As shown in FIG. 4, coolant conditioning unit 230 includes a first coolant loop wherein chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second coolant loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and returned from the system water return manifold of the liquid-cooled electronics rack via the system water supply hose 235 and system water return hose 236, respectively.

Figure 5:
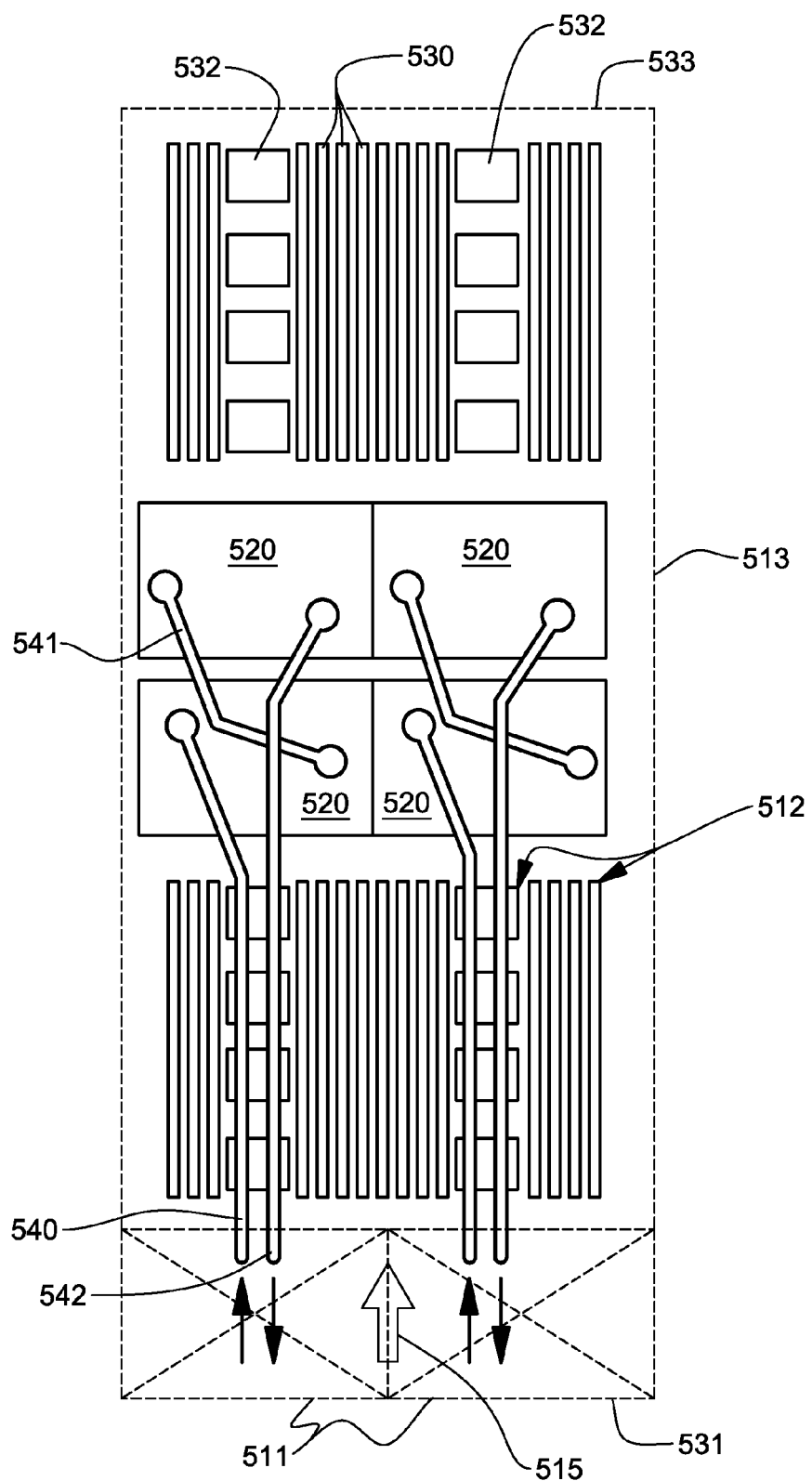
FIG. 5 is a plan view of one embodiment of an electronic subsystem layout illustrating a hybrid cooling system for cooling components of the electronic subsystem, in accordance with one or more aspects of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated coolant-based cooling system further includes multiple coolant-carrying tubes connected to and in fluid communication with coolant-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
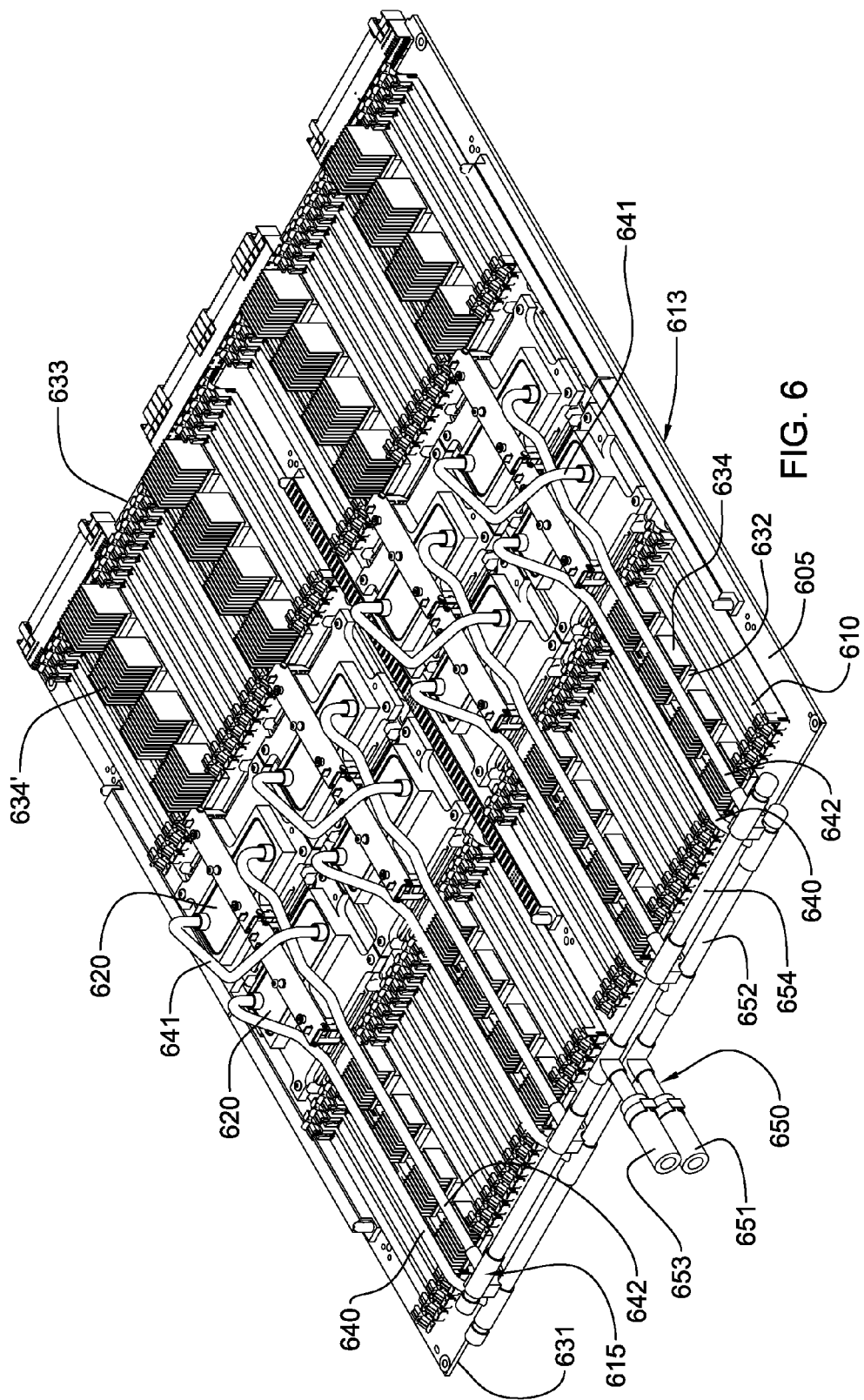
FIG. 6 depicts one detailed embodiment of a partially-assembled electronic subsystem layout, wherein the electronic subsystem includes eight heat-generating electronic components to be actively cooled, each having a respective coolant-cooled structure of a coolant-based cooling system coupled thereto, in accordance with one or more aspects of the present invention.

FIG. 6 depicts in greater detail an alternate electronics drawer layout comprising eight processor modules, each having a respective coolant-cooled cold plate of a coolant-based cooling system coupled thereto. The coolant-based cooling system is shown to further include associated coolant-carrying tubes for facilitating passage of liquid coolant through the coolant-cooled cold plates and a header subassembly to facilitate distribution of coolant to and return of coolant from the coolant-cooled cold plates. By way of specific example, the coolant passing through the coolant-based cooling subsystem is chilled water.

As noted, various coolants significantly outperform air in the task of removing heat from heat-generating electronic components of an electronic system, and thereby more effectively maintain the components at a desirable temperature for enhanced reliability and peak performance. As coolant-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet design requirements.

Thus, presented herein in one aspect is a robust coolant-assisted cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected coolant-cooled cold plates depends, for example on the desired device temperature, available coolant temperature and coolant flow rate, and the total heat load being dissipated from each electronic component.

More particularly, FIG. 6 depicts a partially assembled electronic system 613 and an assembled coolant-based cooling system 615 coupled to primary heat-generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the coolant-cooled cold plates 620 of the coolant-based cooling system 615.

In addition to coolant-cooled cold plates 620, coolant-based cooling system 615 includes multiple coolant-carrying tubes, including coolant supply tubes 640 and coolant return tubes 642 in fluid communication with respective coolant-cooled cold plates 620. The coolant-carrying tubes 640, 642 are also connected to a header (or manifold) subassembly 650 which facilitates distribution of coolant to the coolant supply tubes and return of coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Coolant-based cooling system 615 comprises a pre-configured monolithic structure which includes multiple (pre-assembled) coolant-cooled cold plates 620 configured and disposed in spaced relation to engage respective heat-generating electronic components. Each coolant-cooled cold plate 620 includes, in this embodiment, a coolant inlet and a coolant outlet, as well as an attachment subassembly (i.e., a cold plate/load arm assembly). Each attachment subassembly is employed to couple its respective coolant-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 642. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a coolant outlet of one coolant-cooled cold plate to the coolant inlet of another coolant-cooled cold plate to connect in series fluid flow the cold plates, with the pair of cold plates receiving and returning coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described cooling approach of FIGS. 2-6 is an effective solution for circulating water through coolant-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, may be disposed within each electronics rack. As explained above, heat load carried by the system coolant circulating through the coolant-cooled components in the coolant-cooled electronics rack is rejected to facility chilled water passing through the second coolant path through the active water-to-water heat exchangers within the coolant conditioning units disposed within the rack units.

As noted, in one implementation, the above-described cooling subassemblies for a particular electronic subsystem (or system) are relatively rigid structures employing, for example, rigid tubing interconnecting coolant-cooled cold plates and the headers (or manifold structures). In such an implementation, the multiple cold plates may be designed, by way of example, with a one to two millimeter compliance to accommodate differences in component or module height. Field replacement (i.e., replacement at a customer facility), of an electronic component or module being cooled by such a cooling apparatus may be difficult. For example, if a single electronic component attached to the cold plate assembly fails, the entire electronic subsystem (or node) might need to be replaced. To address this, it is desirable to provide a coolant-based cooling solution which allows for more ready replacement of an individual electronic component or module (for example) at the customer facility, rather than having to send an entire electronic subsystem (or node) back to a manufacturer for replacement or repair.

Field-replacability can be facilitated by providing cooling subassemblies that employ, for example, more flexible tubing interconnecting the coolant-cooled cold plates. One approach to such a subassembly 700 is depicted in FIG. 7A, wherein multiple cooled electronic assemblies 710 are depicted interconnected in fluid communication. In this approach, flexibility in the interconnect tubing allows for a particular coolant-cooled cold plate 701 to be decoupled at its interface with an electronic module 702 resident on, in this example, a substrate 704. Decoupling is facilitated by providing a thermal interface material 703, which allows for subsequent reworking of the cooled electronic assembly 710. By way of example, commonly assigned U.S. Pat. No. 7,420,808 B2, depicts cooling subassemblies which comprise multiple cooled electronic assemblies, such as schematically depicted in FIG. 7A.

Provided herein, in another aspect, is a novel cooled electronic assembly which allows, for example, the use of more rigid interconnect tubing within the coolant-cooled electronic subsystem, while still allowing for "in-field" detaching of the cooled electronic assembly, or disassembly of the cooled electronic assembly in situ within the coolant-cooled electronic subsystem. Advantageously, the cooled electronic assemblies disclosed herein also facilitate, for example, replacement of one or more coolant-cooled electronic modules without discontinuing operation or cooling of the electronic subsystem. This is accomplished herein with an assembly comprising a coolant manifold structure that is detachably coupled to a coolant-cooled electronic module which has integrated therein one or more coolant-carrying channels configured to facilitate flow of coolant through the module, and thereby, cooling of the one or more electronic components within the module.

FIG. 7B is a schematic of such a cooling approach, wherein a coolant-cooled electronic subsystem 720 is illustrated comprising a coolant manifold structure 721 detachably coupled to a coolant-cooled electronic module 722. In the depicted embodiment, one or more coolant-carrying channels 725 are integrated within the coolant-cooled electronic module (or integrated electronic module) 722, so as to reside within the electronic module, for example, within an encapsulation of the module, or within a module lid enclosing one or more electronic components within the module. By way of example, the coolant-cooled electronic module is illustrated on a substrate 724. In the depicted embodiment, the coolant manifold structure 721 includes a coolant inlet 726 (which may comprise a coolant inlet manifold) and a coolant outlet 727 (which may comprise a coolant outlet manifold). Coolant inlet 726 and coolant outlet 727 are configured and disposed to be in fluid communication with the one or more coolant-carrying channels 725 of coolant-cooled electronic module 722 when the coolant manifold structure 721 is detachably coupled to the electronic module.

Advantageously, integrating one or more coolant channel (s) directly within the electronic module allows for enhanced heat transfer to coolant flowing through the cooled electronic assembly. However, an issue arises with detachability of the resultant assembly, particularly if detaching is to occur in the field. With detaching of such an assembly, there is the possibility of coolant contamination within the electronic system (illustrated in FIG. 7B). This coolant contamination may have different origins. In a drained coolant system, residual coolant could be trapped within the coolant lines or tubings, for example, interconnecting multiple cooled electronic assemblies, or in an un-drained system, coolant could escape from the coolant manifold structure, as well as from interconnect tubings or lines between electronic assemblies.

Before discussing an assembly or decoupling process which addresses this contamination issue, FIGS. 8A-9C are described. These figures illustrate various additional embodiments of a cooled electronic assembly, in accordance with one or more aspects of the present invention. In these embodiments, one or more coolant-carrying channels are again integrated within the electronic module itself, for example, within a module lid (or within an encapsulant) in direct contact with one or more electronic components (such as one or more integrated circuit die or chips), or may be formed integral with the electronic component(s) so as to be disposed within the resultant module.

In the embodiment of FIG. 8A, a cooled electronic assembly 800 is illustrated, which includes a coolant-cooled electronic module 810. Coolant-cooled electronic module 810 comprises a module lid 811 which at least partially encloses an electronic component 812, such as an integrated circuit chip or stack of integrated circuit chips, residing on or supported by a substrate 813 (to which, in one embodiment, module lid 811 is coupled). Integrated within coolant-cooled electronic module 810 is a heat exchanger 815 which comprises one or more coolant-carrying channels. In one embodiment, heat exchanger 815 may comprise channels etched into the back side of an integrated circuit chip or stack of integrated circuit chips.

A coolant manifold structure 820 is detachably coupled to the coolant-cooled electronic module 810, and inlet and outlet tubing 821, 822, respectively couple to a coolant inlet and a coolant outlet of coolant manifold structure 820, to provide flow of coolant through coolant manifold structure 820. As explained herein, coolant manifold structure 820 is, in one embodiment, a monolithic structure that is coupled to coolant-cooled electronic module 810 to facilitate flow of coolant through heat exchanger 815 integrated within the electronic module. A load arm 830 is a mechanical component with, for example, an integrated spring, to introduce a load to activate a land grid array of the integrated electronic module, in a manner similar to that described in the above-referenced, commonly assigned U.S. Pat. No. 7,420,808 B2. Note that in this implementation, module lid 811 does not need to be thermally conductive. Also, note that the coolant manifold structure 820 may include coolant sealing features (such as O-rings or gaskets) to prevent coolant from leaking at the passageway interfaces of the coolant manifold structure 820 and the coolant-cooled electronic module 810.

FIG. 8B is a partially exploded view of a more detailed embodiment of a cooled electronic assembly, in accordance with one or more aspects of the present invention. In this embodiment, the cooled electronic assembly includes an electronic component 851, such as an integrated circuit chip or stack of integrated circuit chips, mounted to a substrate 852. Electronic component 851 may be electrically connected to substrate 852 via an array of electrical interconnects 853, and an under-fill (or adhesive) 854 may be provided to bond electronic component 851 to substrate 852. In this embodiment, a module lid 860 has integrated therein a heat exchanger 865. By way of example, heat exchanger 865 may comprise a first die 866 and a second die 867 bonded together, with the first die defining inlet(s) and outlet(s) of the heat exchanger, and the second die 867 defining a plurality of coolant-carrying micro-channels. Heat exchanger 865 is bonded by an adhesive material 868 to an inner surface of module lid 860, which further includes openings 861, 862, aligned with the inlet(s) and outlet(s) of heat exchanger 865 to facilitate the flow of coolant through the heat exchanger. In one specific embodiment, first and second dies 866, 867 may comprise silicon dies, and first die 866 may be interfaced or coupled to the electronic component by a thermal interface material and a fixed seal band or gasket (not shown) around the perimeter of the heat exchanger and electronic component.

In this embodiment, the assembly includes a coolant manifold structure 870 with a coolant inlet 871 and a coolant outlet 872, which may comprise respective coolant manifolds. Coolant inlet 871 and coolant outlet 872 are configured and positioned to align to the openings 861, 862, in module lid 860 when coolant manifold structure 870 is detachably coupled to the module lid. Inner containment O-rings 873, 874 may be provided, encircling the fluid coupling of coolant manifold structure 870 to module lid 860, and inlet and outlet tubings 821, 822 facilitate the flow of coolant through coolant manifold structure 870, and thus, the coolant-cooled electronic module, or more particularly, the heat exchanger integrated (in this example) with the module lid. Load arm 830 applies a mechanical force to, for example, activate the land grid array connection of the integrated module.

FIGS. 9A-9C depict another embodiment of a cooled electronic assembly 900, in accordance with one or more aspects of the present invention. Referring collectively to FIGS. 9A-9C, cooled electronic assembly 900 is shown to include a coolant-cooled electronic module 910, residing on a substrate 911, and a coolant manifold structure 920 detachably coupled to coolant-cooled electronic module 910 via, for example, multiple fasteners 930 at the corners of the electronic assembly 900. Coolant-cooled electronic module 910 comprises one or more electronic components within the module, as well as one or more coolant-carrying channels, with multiple channels being employed in the embodiment of FIGS. 9A-9C. The multiple channels have multiple heat exchanger inlets 912 and outlets 913 formed within module lid 914 of the coolant-cooled electronic module 910. Detachable coolant manifold structure 920 comprises, in this example, a coolant inlet 921 and a coolant outlet 922, which are designed (in one embodiment) as a coolant inlet manifold and coolant outlet manifold, respectively. The coolant inlet and coolant outlet of the manifold are configured and positioned to align over the coolant inlets 912 and outlets 913 of the heat exchanger within the coolant-cooled electronic module 910. Inner containment rings (or O-rings) 923, 924, may be provided within coolant manifold structure 920 to facilitate a fluid-tight coupling of the coolant manifold structure 920 to the integrated electronic module 910 at the interface between the manifold structure and module. Tubing 941, 942 couples to the coolant manifold structure 920 in fluid communication with the coolant inlet manifold and coolant outlet manifold to facilitate the flow of coolant through the coolant-carrying channels of the coolant-cooled electronic module 910.

As noted, one issue addressed herein is mitigating possible coolant contamination of an electronic system with decoupling of a coolant manifold structure of a cooled electronic assembly (such as described hereinabove) in place, for example, within an operating electronic subsystem of an electronics rack. Field replacability of a cooled electronic assembly, or more particularly, the coolant-cooled electronic module of such an assembly, provides significant cost savings and convenience advantages compared with, for example, shutting an electronic subsystem down, and returning the subsystem to a manufacturer for replacement of a module. There are multiple approaches to field replacability of an assembly or a coolant-cooled electronic module such as described herein. Several examples are described below with reference to FIGS. 10A-11C.

Figure 10A:
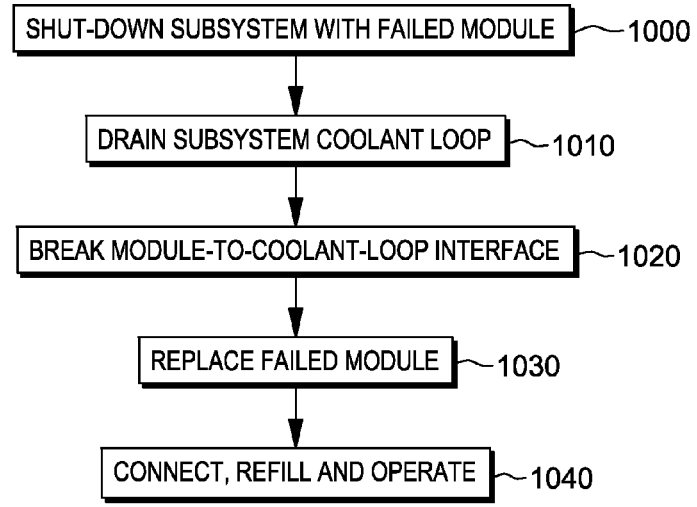
FIG. 10A depicts one embodiment of a process for decoupling a coolant-cooled electronic module and a coolant manifold structure of a cooled electronic assembly within a coolant-cooled electronic subsystem, in accordance with one or more aspects of the present invention.
Figure 10B:
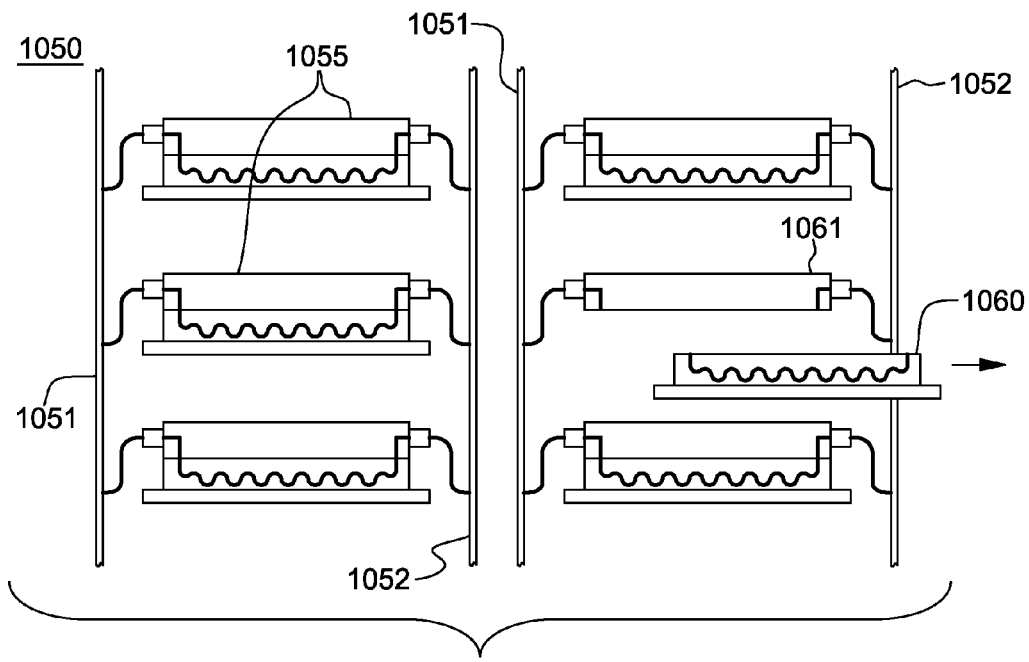
FIG. 10B illustrates decoupling of a coolant-cooled electronic module from a coolant manifold structure, for example, pursuant to the process of FIG. 10A, in accordance with one or more aspects of the present invention.

FIGS. 10A & 10B illustrate one approach to field replacability in a cooled electronic system where there are no fluid valves coupling the coolant manifold structures to the subsystem coolant loop. By way of example, such a system may employ rigid or semi-rigid tubing coupling the coolant manifold structures in substantially fixed positions within the electronic system. This is illustrated in FIG. 10B, where multiple cooled electronic assemblies 1055 are shown in position in fluid communication with a subsystem-level coolant inlet manifold 1051 and a subsystem-level coolant outlet manifold 1052 (by way of example only). As illustrated in this figure, one coolant-cooled electronic module 1060 being decoupled (for example, for field-replacing thereof) from its associated coolant manifold structure 1061.

Referring to the exchange process of FIG. 10A, a coolant-cooled electronic module may be replaced by shutting down the subsystem (or board) with the electronic module to be replaced 1000, and draining the tubing of the subsystem (or board) coolant loop 1010. Optionally, the tubing of the subsystem coolant loop may be flushed with air to remove the coolant. Thereafter, the module-to-coolant loop interface may be broken by detaching the coolant-cooled electronic module from its associated coolant manifold structure (see FIG. 10B). The detached coolant-cooled electronic module may then be replaced 1030. By draining the subsystem coolant loop prior to decoupling the coolant-cooled electronic module from its coolant manifold structure, discharge of coolant onto, for example, the associated electronic board or other components of the electronic system or subsystem is reduced, or even eliminated. A new coolant-cooled electronic module may then be connected to the coolant manifold structure remaining coupled within the cooled electronic subsystem, after which the subsystem coolant loop is refilled to allow for operation of the cooled electronic system 1040.

Figure 11A:
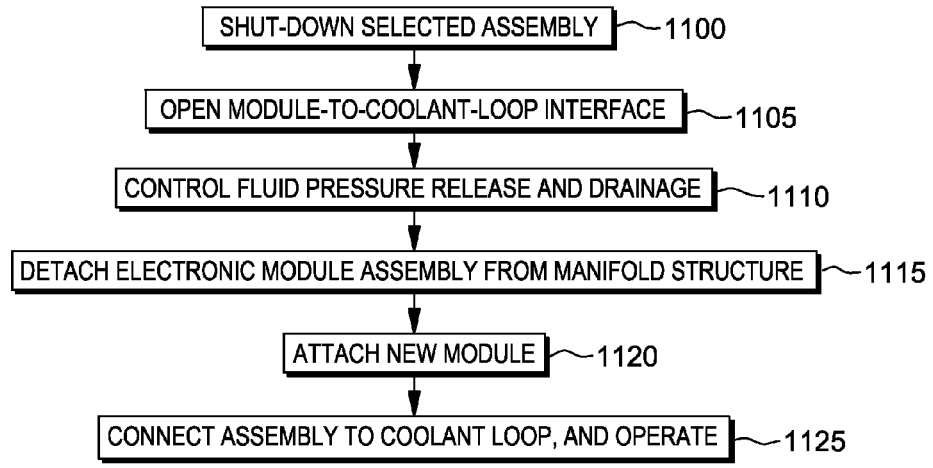
FIG. 11A depicts an alternate process for detaching a coolant-cooled electronic module from a coolant manifold structure of a cooled electronic assembly, in accordance with one or more aspects of the present invention.
Figure 11B:
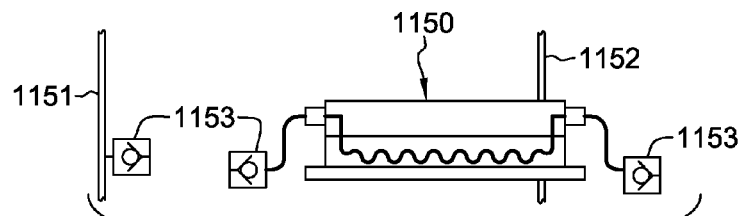
FIG. 11B illustrates decoupling of a cooled electronic assembly, comprising a coolant manifold structure and coolant-cooled electronic module to be detached, in accordance with one or more aspects of the present invention.

FIGS. 11A & 11B depict an alternate process of field-replacement, wherein valves are employed in association with the individual cooled electronic assemblies described herein. The valves allow for the decoupling and field-replacability of a particular electronic assembly as a unit, as illustrated, by way of example, in FIG. 11B, without discontinuing operation of the cooled electronic system.

Figure 12A:
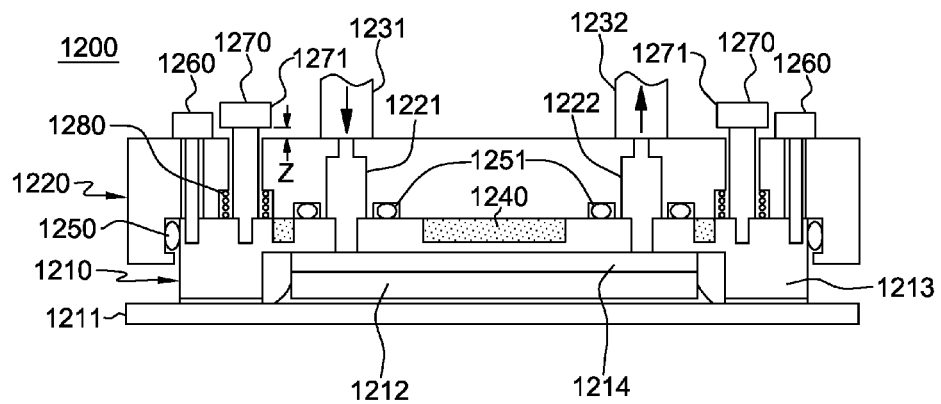
FIG. 12A is a cross-sectional elevational view of another embodiment of a cooled electronic assembly, comprising a coolant-cooled electronic module and a coolant manifold structure, with the coolant manifold structure shown in a first, operational position relative to the coolant-cooled electronic module, in accordance with one or more aspects of the present invention.
Figure 12B:
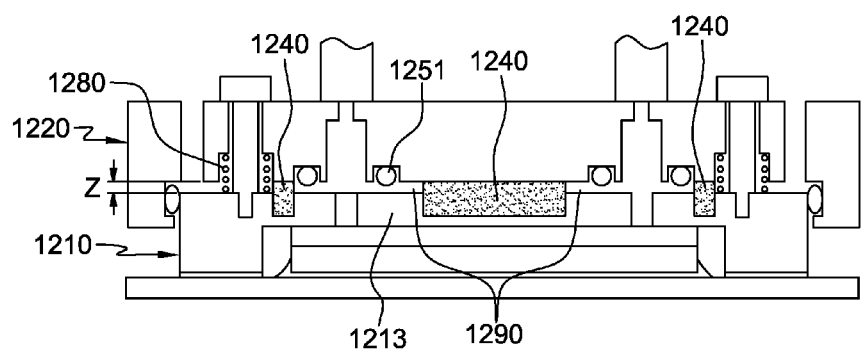
FIG. 12B depicts the cooled electronic assembly of FIG. 12A, and illustrates the coolant manifold structure in a second, partially-detached position relative to the coolant-cooled electronic module, in accordance with one or more aspects of the present invention.
Figure 12C:
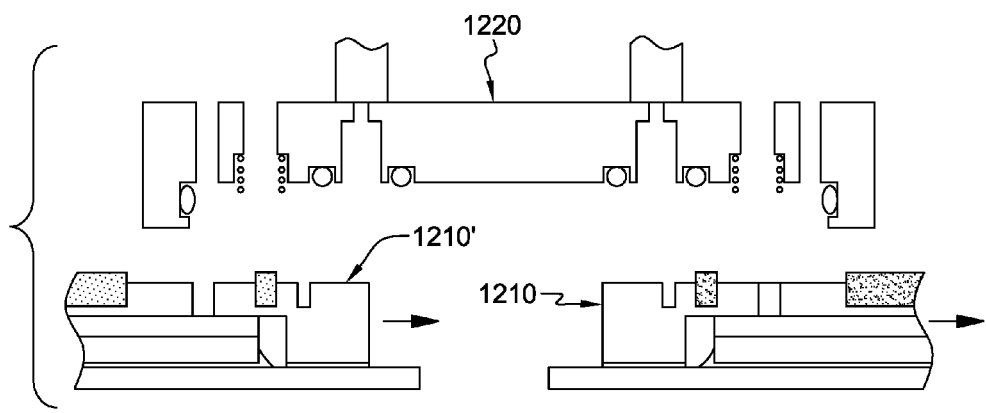
FIG. 12C illustrates further detaching of the coolant manifold structure from the coolant-cooled electronic module and, by way of example, reusing of the coolant manifold structure in a new cooled electronic assembly, in accordance with one or more aspects of the present invention.

As shown in FIG. 11B, a subsystem-level coolant supply 1151 and return 1152 have valving 1153, such as quick connect/disconnect valving associated therewith, as well as with the cooled electronic assembly 1150. This valving 1153 allows for the decoupling and removal of the cooled electronic assembly 1150 from, for example, an active electronic subsystem of an electronics rack. One process for accomplishing this active removal is depicted in FIG. 11A. Referring to FIG. 11A, the coolant-cooled electronic module of the assembly to be replaced is shut down 1100, and the module-to-coolant-loop interface 1105 is broken by disconnecting the assembly at the quick connect valving. Note that in this embodiment, the subsystem coolant loop is or may still be operational, resulting in pressurized coolant flowing through the module, that is, until the assembly is disconnected. A controlled fluid pressure release and drain process may be employed 1110, which may include connecting a drain tube with a quick connect to the cooled electronic assembly, and allowing any coolant within the disconnected assembly to be drained from the assembly, for example, by gravitational force, or pressure- or vacuum-assist. After draining coolant from the cooled electronic assembly, the coolant manifold structure may be detached from the electronic module portion of the electronic assembly employing, for example, a sequence such as depicted in FIGS. 12A-12C and described below. (Advantageously, the approach depicted in FIGS. 12A-12C and described below, presents an assembly and decoupling process employing a sequential unsealing of the coolant manifold structure from the coolant-cooled electronic module.) Thereafter, a new coolant-cooled electronic module may be attached to the coolant manifold structure 1120, and the resultant cooled electronic assembly can be reconnected within the subsystem coolant loop, and allowed to become operational within the electronic subsystem 1125.

Figure 11C:
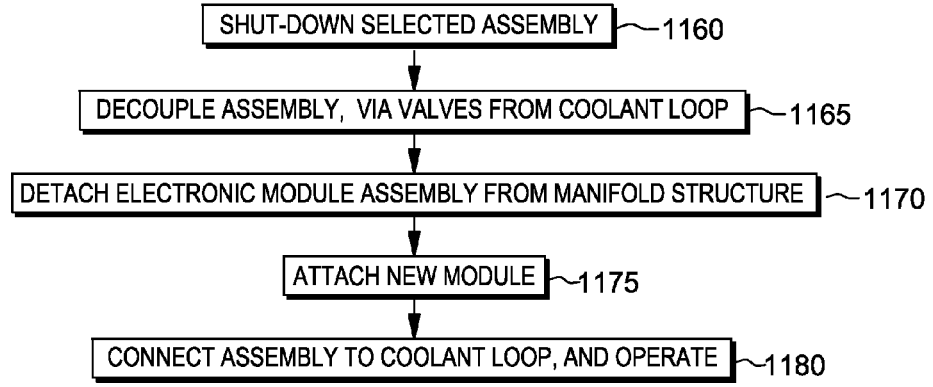
FIG. 11C depicts another embodiment of a process for detaching a coolant manifold structure and a coolant-cooled electronic module of the cooled electronic assembly, in accordance with one or more aspects of the present invention.

FIG. 11C depicts an alternate approach to decoupling a cooled electronic assembly from an electronic subsystem, such as depicted in FIG. 11B. In this approach, the cooled electronic assembly to be replaced is first shut down 1160, and then decoupled via the assembly-level valves from, for example, the electronic subsystem coolant loop 1165. Note that the subsystem coolant loop may still be operational, resulting in a pressurized electronic assembly. Next, the coolant-cooled electronic module may be detached from the associated coolant manifold structure of the assembly using, for example, a stepwise decoupling, such as depicted in FIGS. 12A-12C and described below 1170. A new coolant-cooled electronic module may then be attached to the coolant manifold structure to form a new assembly 1175, which is then connected to the subsystem coolant loop, and the electronic module is allowed to become operational 1180.

As discussed below, the assembly of FIGS. 12A-12C, and the sequential unsealing concept disclosed herein, employ a coolant-absorbent material to advantageously prevent spillage of residual coolant during decoupling of the assembly. Pressure release is facilitated by providing a containment volume defined between the manifold and module with a controlled travel distance z between a first position and second position of the coolant manifold structure relative to the coolant-cooled electronic module. The needed volume depends on the stiffness of the components, and the amount of absorbent material is selected to be able to contain substantially all of the coolant in the manifold structure and any tubing components between the valve(s) and the manifold structure.

As noted, FIGS. 12A-12C depict an enhanced cooled electronic assembly and method of decoupling a manifold structure from the coolant-cooled electronic module thereof, in accordance with one or more aspects of the present invention.

Referring to FIG. 12A, a cooled electronic assembly 1200 is shown to comprise a coolant-cooled electronic module 1210 and a coolant manifold structure 1220 detachably coupled thereto. Coolant-cooled electronic module 1210 includes, by way of example, a substrate 1211, upon which one or more electronic components 1212 reside. By way of example, the electronic component(s) may comprise one or more integrated circuit chips. Additionally, electrical interconnect may couple the electronic component to interconnect metallization on or within substrate 1211. Coolant-cooled electronic module 1210 further includes a coolant lid 1213 and a heat exchanger 1214. Module lid 1213 is shown (in one embodiment) to at least partially enclose electronic component 1212 and heat exchanger 1214. Heat exchanger 1214 comprises one or more coolant-carrying channels (not shown) which allow for the flow of coolant therethrough. In one embodiment, the channels may be micro-channels defined, for example, in a silicon substrate, either coupled to electronic component 1212, or comprising part of electronic component 1212.

FIG. 12A depicts coolant manifold structure 1220 in a first position relative to coolant-cooled electronic module 1210. In this position, interface surfaces of the coolant manifold structure are in direct contact with interface surfaces of the coolant-cooled electronic module, or more particularly, module lid 1213. In the depicted embodiment, coolant manifold structure 1220 includes a coolant inlet 1221 and a coolant outlet 1222, which in one embodiment, may comprise respective coolant manifolds that facilitate the flow of coolant through the coolant-cooled electronic module, and more particularly, through the one or more coolant-carrying channels of heat exchanger 1214 integrated within the module. Inlet tubing 1231 is in fluid communication with coolant inlet 1221 of coolant manifold structure 1220, and outlet tubing 1232 is in fluid communication with coolant outlet 1222 of coolant manifold structure 1220.

Advantageously, in the depicted embodiment, coolant-absorbent material 1240 is provided at the interface between coolant-cooled electronic module 1210 and coolant manifold structure 1220. This coolant-absorbent material is selected, positioned, sized, and configured to absorb coolant during the decoupling process, as described further below. By way of example, coolant-absorbent material 1240 may reside within one or more recesses formed within module lid 1213 and/or within coolant manifold structure 1220. In the depicted embodiment, the absorbent material is illustrated, by way of example only, within recesses in module lid 1213. Note that in the first position (illustrated in FIG. 12A), the coolant-absorbent material 1240 is compressed between the coolant-cooled electronic module 1210 and the coolant manifold structure 1220. The cooled electronic assembly 1200 further includes an outer containment ring 1250, which may comprise a radial O-ring residing within a recess formed within coolant manifold structure 1220, and inner containment rings 1251 around the coolant passages between the coolant-cooled electronic module 1210 and the coolant manifold structure 1220. In the first position of FIG. 12A, inner containment rings 1251 are compressed and ensure that coolant does not leak at the interface between the electronic module and the manifold structure.

The cooled electronic assembly 1200 further includes compression fasteners 1260 and retention fasteners 1270. In one embodiment, the compression fasteners and retention fasteners may comprise compression screws and retention screws. In the embodiment of FIG. 12A, compression fasteners 1260 secure into, by way of example, module lid 1213 of coolant-cooled electronic module 1210 and tighten so that a fluid-tight seal is formed between the manifold structure and the electronic module. Note that, in this embodiment, the retention fasteners 1270 have fastener heads 1271 that are raised (in the first position of the assembly) slightly above an upper surface of coolant manifold structure 1220, and spring-biasing 1280 is provided between coolant-cooled electronic module 1210 and coolant manifold structure 1220, for example, in appropriately configured recesses about retention fasteners 1270. Note that retention fastener heads 1271 are spaced a distance 'z' above the manifold structure 1220. This distance 'z' is the travel distance by which the manifold structure is allowed to move from the first position illustrated in FIG. 12A to a second position illustrated in FIG. 12B.

Referring to FIG. 12B, in the second position, the coolant manifold structure 1220 defines a containment volume 1290 between the manifold structure and the module lid 1213. This containment volume allows for the expansion of the compressed coolant-absorbent material as the material absorbs coolant within the containment volume. Note that in the second position of FIG. 12B, the inner containment rings 1251 are open, that is, are no longer forming a fluid-tight seal about the aligned passages between the coolant-cooled electronic module 1210 and manifold structure 1220. In the second position, the compression fasteners 1260 (see FIG. 12A) have been removed, and the coolant manifold structure 1220 has moved distance 'z' due to the spring-biasing 1280 between the electronic module and manifold structure. In this embodiment, outer containment ring 1250 facilitates defining containment volume 1290 between the electronic module and the manifold structure. The coolant-absorbent material 1240 is exposed to coolant within this containment volume and absorbs any excess coolant within the containment volume resulting from the stepwise decoupling of the manifold structure from the electronic module.

After allowing any excess coolant to be absorbed by the coolant-absorbent material 1240, the coolant manifold structure can be detached from the electronic module 1210 and a new electronic module 1210' (FIG. 12C) may be inserted in its place to establish a new cooled electronic assembly comprising the new electronic module. By way of example, attachment of the coolant manifold structure 1220 to the new electronic module 1210' may proceed in reverse order to that described above in connection with decoupling of the coolant manifold structure from the coolant-cooled electronic module to be replaced.

Note, for example, that super-absorbent polymers (SAPs) may be employed as the absorbent material discussed herein. Super-absorbent polymers, classified as hydro-gels when cross-linked, absorb aqueous solution through hydrogen bonding with water molecules. A SAP might absorb as much as 30-60 times its own volume. By way of example, considering 20%-30% SAP area coverage on, for example, a 5×5 $cm^2$ coolant-cooled electronic module, a 5 $cm^2$ absorbent material may be employed. The thickness of the SAP material may depend, in part, on the z travel for the distance between the first position and second position of the manifold structure relative to the integrated electronic module within the assembly. Super-absorbent polymer, such as described herein, is available from Evonik Industries, AG, of Essen, Germany.

Advantageously, using the decoupling approach of FIGS. 12A-12C, in combination with the approaches of FIGS. 11A-11C, a cooled electronic assembly may be disconnected from a subsystem coolant loop, and if desired, optionally partially drained. The compression fasteners may then be removed, resulting in a controlled travel z of the coolant manifold structure from its first position, illustrated in FIG. 12A, to its second position, illustrated in FIG. 12B. In the second position, the coolant manifold structure is maintained in position by the retention fasteners. The inner containments rings open, resulting in the absorbent material absorbing any coolant draining into the containment volume. The outer containment ring is configured and sized to remain active at this point, and prevent coolant from spilling out onto, for example, the underlying electronic board or other electronic subsystem components. After the coolant is absorbed, the retention fasteners may be removed, and the manifold structure lifted apart from the electronic module, which allows for the exchange of the module with a new module, containing a new, dry coolant-absorbent material, as illustrated in FIG. 12C.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooled electronic assembly comprising:
   a coolant-cooled electronic module, the coolant-cooled electronic module comprising:
      at least one electronic component; and
      at least one coolant-carrying channel integrated within the coolant-cooled electronic module and configured to facilitate flow of coolant therethrough for cooling the at least one electronic component;
   a coolant manifold structure detachably coupled to the coolant-cooled electronic module, the coolant manifold structure comprising a coolant inlet and a coolant outlet in fluid communication with the at least one coolant-carrying channel of the coolant-cooled electronic module, the coolant manifold structure facilitating the flow of the coolant through the at least one coolant-carrying channel of the coolant-cooled electronic module, and thereby cooling of the at least one electronic component; and a coolant-absorbent material positioned at an interface of the coolant-cooled electronic module and the coolant manifold structure, the coolant-absorbent material absorbing excess of the coolant at the interface during detaching of the coolant manifold structure from the coolant-cooled electronic module, the coolant-absorbent material is a compressible, coolant-absorbent material positioned at the interface of the coolant-cooled electronic module and the coolant manifold structure, and wherein the coolant manifold structure is detachably coupled to the coolant-cooled electronic module in one of a first position or a second position, the coolant-absorbent material being at least partially compressed in the first position, and at least partially uncompressed in the second position, the second position facilitating the coolant-absorbent material's absorbing of the coolant at the interface during detaching of the coolant manifold structure from the coolant-cooled electronic module.

2. The cooled electronic assembly of claim 1, wherein the coolant-absorbent material resides at least partially within a recess in at least one of the coolant-cooled electronic module or the coolant manifold structure at the interface of the coolant-cooled electronic module and the coolant manifold structure.

3. The cooled electronic assembly of claim 1, further comprising an outer containment ring configured to define, at least partially, a containment volume between the coolant manifold structure and the coolant-cooled electronic module with the coolant manifold structure in the second position, wherein the coolant-absorbent material at least partially resides within the containment volume with the coolant manifold structure in the second position.

4. The cooled electronic assembly of claim 3, further comprising at least one inner containment ring configured to define, with the coolant manifold structure detachably coupled to the coolant-cooled electronic module in the first position, a coolant-tight seal where at least one of the coolant inlet or the coolant outlet of the coolant manifold structure is in fluid communication with the at least one coolant-carrying channel of the coolant-cooled electronic module and, with the coolant manifold structure detachably coupled to the coolant-cooled electronic module in the second position, to unseal where the at least one of the coolant inlet or the coolant outlet of the coolant manifold structure is in fluid communication with the at least one coolant-carrying channel of the coolant-cooled electronic module, thereby allowing any of the coolant at the interface between the coolant manifold structure and the coolant-cooled electronic module into the containment volume defined, at least partially, by the outer containment ring.

5. The cooled electronic assembly of claim 1, further comprising at least one compression fastener and at least one retention fastener, the at least one compression fastener holding the coolant manifold structure in the first position relative to the coolant-cooled electronic module, and upon removal of the at least one compression fastener, the at least one retention fastener holding the coolant manifold structure in the second position relative to the coolant-cooled electronic module.

6. The cooled electronic assembly of claim 5, further comprising at least one elastic member disposed between the coolant manifold structure and the coolant-cooled electronic module, the at least one elastic member facilitating moving of the coolant manifold structure from the first position to the second position with detaching of the at least one compression fastener.

7. The cooled electronic assembly of claim 1, wherein the coolant inlet of the coolant manifold structure comprises a first manifold and the coolant outlet of the coolant manifold structure comprises a second manifold, and wherein the coolant manifold structure further comprises a first fluid-tight gasket around the first manifold and a second fluid-tight gasket around the second manifold at the interface of the coolant manifold structure and the coolant-cooled electronic module.

8. The cooled electronic assembly of claim 1, wherein the coolant-cooled electronic module comprises a module lid, the module lid at least partially enclosing at least one electronic component, and wherein the at least one coolant-carrying channel is integrated within the module lid, and is disposed within the coolant-cooled electronic module and coupled to the at least one electronic component.

9. A method of fabricating a cooled electronic assembly comprising:
   providing a coolant-cooled electronic module comprising:
      at least one electronic component; and
      at least one coolant-carrying channel integrated within the coolant-cooled electronic module and configured to facilitate flow of coolant therethrough for cooling the at least one electronic component; and
   detachably coupling a coolant manifold structure to the coolant-cooled electronic module, the coolant manifold structure comprising a coolant inlet and a coolant outlet within the coolant manifold structure, the detachably coupling comprising coupling in fluid communication the coolant inlet and the coolant outlet of the coolant manifold structure to the at least one coolant-carrying channel of the coolant-cooled electronic module, the coolant manifold structure facilitating the flow of the coolant through the at least one coolant-carrying channel of the coolant-cooled electronic module, and thereby cooling of the at least one electronic component; and
   providing a coolant-absorbent material positioned at an interface of the coolant-cooled electronic module and the coolant manifold structure, the coolant-absorbent material absorbing excess of the coolant at the interface during detaching of the coolant manifold structure from the coolant-cooled electronic module, the coolant-absorbent material is a compressible, coolant-absorbent material positioned at the interface of the coolant-cooled electronic module and the coolant manifold structure, and wherein the coolant manifold structure is detachably coupled to the coolant-cooled electronic module in one of a first position or a second position, the coolant-absorbent material being at least partially compressed in the first position, and at least partially uncompressed in the second position, the second position facilitating the coolant-absorbent material's absorbing of the coolant at the interface during detaching of the coolant manifold structure from the coolant-cooled electronic module.

10. The method of claim 9, further comprising providing an outer containment ring configured to define, at least partially, a containment volume between the coolant manifold structure and the coolant-cooled electronic module with the coolant manifold structure in the second position, wherein the coolant-absorbent material at least partially resides within the containment volume with the coolant manifold structure in the second position.

11. The method of claim 9, further comprising providing at least one compression fastener and at least one retention fastener, the at least one compression fastener holding the coolant manifold structure in the first position relative to the coolant-cooled electronic module, and upon removal of the at least one compression fastener, the at least one retention fastener holding the coolant manifold structure in the second position relative to the coolant-cooled electronic module.

12. The method of claim 9, wherein the coolant inlet of the coolant manifold structure comprises a first manifold and the coolant outlet of the coolant manifold structure comprises a second manifold, and wherein the coolant manifold structure further comprises a first fluid-tight gasket around the first manifold and a second fluid-tight gasket around the second manifold at the interface of the coolant manifold structure and the coolant-cooled electronic module.

13. The method of claim 9, wherein the coolant-cooled electronic module comprises a module lid, the module lid at least partially enclosing at least one electronic component, and wherein the at least one coolant-carrying channel is integrated within the module lid, and is disposed within the coolant-cooled electronic module and coupled to the at least one electronic component.

14. A method comprising:
decoupling a coolant manifold structure from a coolant-cooled electronic module, the decoupling comprising:
transitioning the coolant manifold structure from a first position to a second position relative to the coolant-cooled electronic module, wherein in the first position, a coolant-absorbent material disposed at an interface between the coolant-cooled electronic module and the coolant manifold structure is at least partially compressed, and in the second position, the coolant-absorbent material is at least partially uncompressed, and wherein the transitioning the coolant manifold structure to the second position defines a coolant-tight containment volume at the interface between the coolant manifold structure and the coolant-cooled electronic module, the coolant-absorbent material residing at least partially within the coolant-tight containment volume;
allowing coolant within the coolant-tight containment volume to be absorbed by the coolant-absorbent material; and
after the allowing the coolant within the coolant-tight contain volume to be absorbed by the coolant-absorbent material, detaching the coolant manifold structure from the coolant-cooled electronic module.

15. The method of claim 14, further comprising, after the decoupling the coolant manifold structure from the coolant-cooled electronic module, detachably coupling another coolant-cooled electronic module to the coolant manifold structure in the first position with a dry coolant-absorbent material disposed at the interface between the another coolant-cooled electronic module and the coolant manifold structure.

16. The method of claim 14, wherein the decoupling the coolant manifold structure from the coolant-cooled electronic module comprises removing at least one compression fastener to allow the coolant manifold structure to transition from the first position to the second position relative to the coolant-cooled electronic module, while leaving at least one retention fastener in place to hold the coolant manifold structure in the second position relative to the coolant-cooled electronic module to allow the coolant-absorbent material to become at least partially uncompressed and absorb the coolant within the coolant-tight containment volume.

\* \* \* \* \*